United States Patent
Simpson (10) Patent No.: US 8,907,750 B2
(45) Date of Patent: Dec. 9, 2014

(54) SYSTEMS AND METHODS FOR IMPEDANCE TUNER INITIALIZATION

(75) Inventor: Gary R. Simpson, Fontana, CA (US)

(73) Assignee: Maury Microwave, Inc., Ontario, CA (US)

( * ) Notice: Subject to any disclaimer, the term of this patent is extended or adjusted under 35 U.S.C. 154(b) by 498 days.

(21) Appl. No.: 13/214,991

(22) Filed: Aug. 22, 2011

(65) Prior Publication Data

US 2012/0049970 A1    Mar. 1, 2012

Related U.S. Application Data

(60) Provisional application No. 61/377,055, filed on Aug. 25, 2010.

(51) Int. Cl.
*H03H 7/38* (2006.01)
*H01P 5/04* (2006.01)
*G01R 27/32* (2006.01)

(52) U.S. Cl.
CPC .. *H01P 5/04* (2013.01); *H03H 7/38* (2013.01); *G01R 27/32* (2013.01)
USPC .......................................... 333/263; 333/17.3

(58) Field of Classification Search
USPC ................................. 333/17.3, 263
See application file for complete search history.

(56) References Cited

U.S. PATENT DOCUMENTS

| 7,034,629 | B2 * | 4/2006 | Tsironis | ....................... 333/17.3 |
| 7,053,628 | B1 | 5/2006 | Tsironis | |
| 7,135,941 | B1 | 11/2006 | Tsironis | |
| 2003/0122633 | A1 | 7/2003 | Tsironis | |

FOREIGN PATENT DOCUMENTS

JP    2000-221233 A    8/2000

OTHER PUBLICATIONS

C. Tsironis, "MPT, a Universal Mult-Purpose Tuner," ARFTG Conference Digest, 2005, pp. 113-117.
C. Tsironis, "A Four Harmonic Wideband Impedance Tuner," Microwave Conference, 2009, pp. 1727-1730.
Chi Chung Yang, "Design Compromise Between the Efficiency and Spectral Re-Growth of Power Amplifiers Using Second Harmonic Source/Load Impedance," Microwave Conference, 1999, pp. 630-633.
PCT International Search Report for International Application No. PCT/US2011/048845, Jan. 10, 2012.
PCT Written Opinion of the International Searching Authority for International Application No. PCT/US2011/048845, Jan. 10, 2012.

* cited by examiner

*Primary Examiner* — Stephen Jones
(74) *Attorney, Agent, or Firm* — Larry K. Roberts (57) ABSTRACT

An exemplary embodiment of a multiple carriage tuner employs a carriage initialization technique, in which at least two of the carriages are initialized at fixed positions. This has the advantage of faster initialization, since multiple carriages can be moving simultaneously, if desired. In another embodiment, a method is described for initializing a mechanical impedance tuner with at least two probe carriages and a center conductor, each of the at least two probe carriages moveable independently along an axis parallel to the center conductor by commanding respective carriage drive motors to move in opposite directions along the axis, recording as a first carriage zero or home position of the first motor a first fixed initialization location indicated by a first sensor signal generated by proximity of the first carriage to the first fixed initialization location so that future positioning of the first carriage is determined from this first zero or home position, and recording as a second carriage zero or home position of the second motor a second fixed initialization location indicated by a second sensor signal generated by proximity of the second carriage to the second fixed initialization location so that future positioning of the second carriage is determined from this second zero or home position.

15 Claims, 7 Drawing Sheets

SYSTEMS AND METHODS FOR IMPEDANCE TUNER INITIALIZATION

CROSS-REFERENCE TO RELATED APPLICATION

This application claims priority from provisional application No. 61/377,055, filed Aug. 25, 2010, the entire contents of which application is incorporated herein by this reference.

BACKGROUND

Figure 1A:
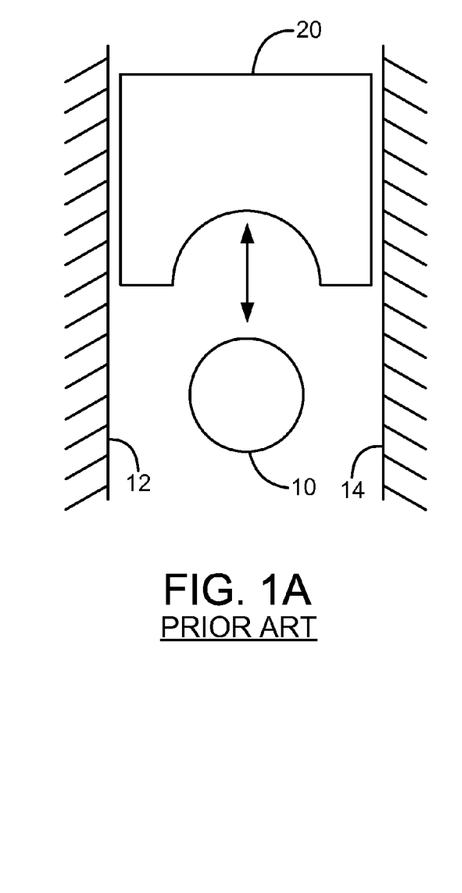
FIG. 1A is a diagrammatic end view of an impedance tuner slab line and probe arrangement.
Figure 1B:
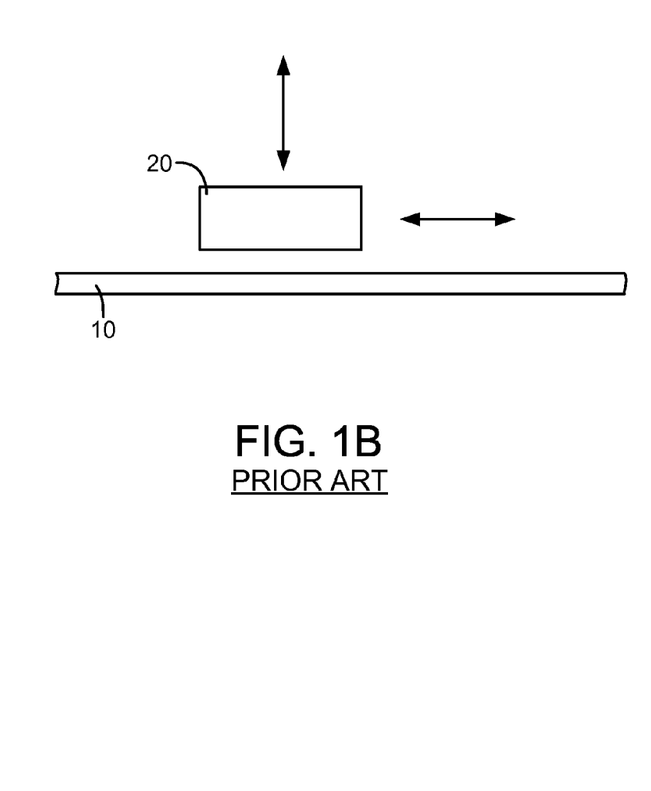
FIG. 1B is a diagrammatic view illustrating movement of the probe in the vertical (transverse to the center conductor) and horizontal (parallel to the center conductor) movement of the tuner probe.

Mechanical Impedance tuners are widely used in characterization of RF devices. The most common type of impedance tuner is the slab line tuner, which typically includes a 50 Ohm TEM slab line, with a movable mismatch probe. FIGS. 1A and 1B illustrate such a tuner in simplified form, with a center conductor 10 supported between opposed conductive ground planes 12, 14 which form the slab line. A mismatch probe 20 is supported for movement along or horizontal to the center conductor, and also in a direction traverse to or vertical to the center conductor. If the mismatch probe is moved out of the electrical fields of the slab line, it has almost no effect, allowing the slab line to look like a good 50 Ohm line. However, if the mismatch probe is moved close to the center conductor, the electrical fields are affected, causing a mismatch. The magnitude of the mismatch is controlled primarily by adjusting the distance of the probe from the center conductor. The phase of the mismatch is controlled by moving the probe in a direction parallel to the center conductor. A similar effect can also be done in other transmission line environments, such as waveguide.

Automated impedance tuners typically use stepper motors to provide remote computer control, to move the probe vertically relative to the center conductor and to move a carriage holding the probe horizontally along the center conductor. The stepper motors are controlled by sending current pulses to the motor, and each current pulse will move the motor by a known amount based on the physical construction of the motor. This means that the control electronics can keep track of the tuner position without any direct position feedback, as long as power is continuously applied.

However, when power is first turned on, position of an impedance tuner with stepper motors is not known. A process called initialization is then performed to determine the position and set the zero point. The initialization consists of moving a motor in one direction until a limit sensor is encountered. The position at or near the limit is then set to zero, and all subsequent moves are relative to that zero position.

Some tuners with multiple carriages do not have a wall between the carriages, allowing the travel range of the carriages to overlap. In this case, the first carriage is initialized at a fixed limit at one end of the tuner. The second carriage is initialized relative to the first carriage while the first carriage is in a known position. This relative initialization is therefore variable and frequency dependent. If there is a third carriage, it would be initialized relative to the second carriage while the second carriage is in a known position. One disadvantage of this method is that initialization of the second carriage cannot begin until the initialization of the first carriage is complete.

BRIEF DESCRIPTION OF THE DRAWINGS

Features and advantages of the disclosure will readily be appreciated by persons skilled in the art from the following detailed description when read in conjunction with the drawing wherein.

DETAILED DESCRIPTION

In the following detailed description and in the several figures of the drawing, like elements are identified with like reference numerals. The figures are not to scale, and relative feature sizes may be exaggerated for illustrative purposes.

An exemplary embodiment of a multiple carriage tuner employs a carriage initialization technique, in which at least two of the carriages are initialized at fixed positions. This has the advantage of faster initialization, since multiple carriages can be moving simultaneously, if desired.

In the case of a two-carriage tuner, the initialization position (or zero position) for each carriage will preferably be at opposite ends of the tuner chassis. Although the distance between carriages may not be known exactly, due to manufacturing tolerances, this is not significant in the tuner operation, since each carriage will always operate over a known range.

In the case of tuners with three or more carriages, the outside two carriages will be initialized at opposite ends of the tuner chassis, as with a two-carriage tuner. The middle carriages can then be initialized at fixed sensors that are accessible to them, or at positions relative to one of the first two carriages.

Even though the initialization of each carriage of a two-carriage tuner is done at fixed positions, independent of any other carriage, it may still be useful to have sensors between carriages as a fail-safe precaution to prevent crashes between carriages. This should never happen in normal operation, but could prevent damage in the case of a malfunction. It also could be reported automatically to the user as an error message. The fail-safe sensors between carriages could be lower cost sensors without the precision required of initialization sensors.

Figure 2A:
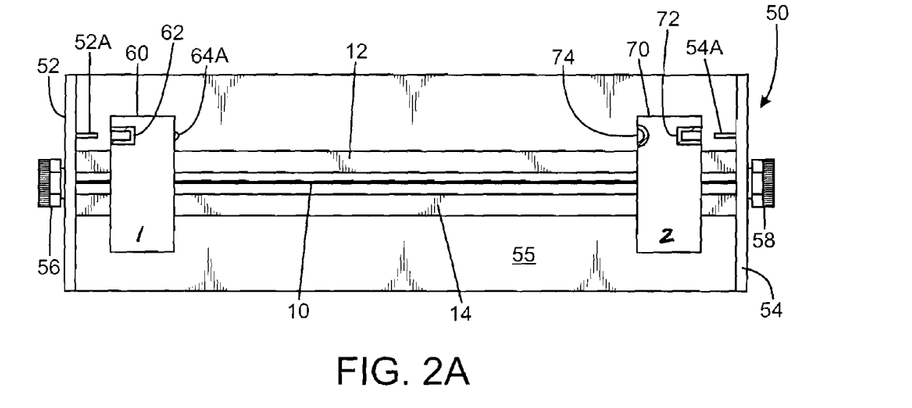
FIG. 2A is a diagrammatic top view illustrating features of an exemplary embodiment of a two-carriage impedance tuner.

FIG. 2A illustrates an exemplary embodiment of a two-carriage impedance tuner, in which each of two carriages 60 and 70 initializes to fixed zero positions at opposite ends of the tuner chassis. The tuner 50 includes a pair of opposed or end walls 52 and 54 on which the center conductor 20 is supported by dielectric bushings (not shown). The end walls are mounted to a bottom plate 55. The opposed conductive ground planes 12, 14 are supported between the end walls. RF connectors 56, 58 are provided for making electrical connection to the center conductor on opposed sides of the tuner. Connector 56 is typically connected or coupled to a device under test (DUT).

Still referring to FIG. 2A, probe carriages 60 and 70 are mounted for movement along an axis parallel to the center conductor 10. Typically the carriages are mounted on guide rails (not shown in FIG. 2A). One rail may have a linear gear rack, for engagement by a rotatable gear mounted on each carriage and driven by a carriage motor, typically a stepper motor, although other types of motors may alternately be employed. By driving the rotatable gear with the carriage motor, a carriage can be moved along the horizontal direction. Since each carriage motor can be independently driven, this allows the carriages to be positioned independently of each other. Other arrangements for positioning the carriage may also be employed, e.g. drive belts or leadscrews.

Carriage 60 has a sensor 62 mounted on the carriage side facing end wall 52, which is configured to sense a pin or other feature 52A extending from the end wall. This allows the carriage 60 to be moved toward the end wall 52 until sensor 62 senses the pin, to initialize the carriage position adjacent the wall 52. At this point the carriage motor drive circuits can be "zeroed" at a known carriage position. Similarly, carriage 70 has a sensor 72 mounted on the carriage side facing end wall 54, which is configured to sense a pin or other feature 54A extending from the end wall 54. This allows the carriage 70 to be moved toward the end wall 54 until sensor 72 senses the pin 54A, to initialize the carriage 70 position adjacent the wall 54, preferably without the carriage coming into physical contact with the wall. In other embodiments, the carriage position at the initialization position adjacent the wall may be in actual contact with the wall. At this point, the carriage motor drive circuits for carriage 70 can be "zeroed" at a known carriage position.

The carriage 70 may optionally have a second sensor 74 mounted on a carriage side facing the carriage 60, configured to sense the fault condition that the carriages 60 and 70 are very close to each other. The sensor 74 may sense a feature 64A on the carriage 60 side facing the carriage 70. The sensor 74 may be a lower resolution sensor than sensors 62 and 72. If the sensor 74 senses feature 64A, the sensor signal is typically treated as a fault or error signal, and the tuner controller can shut down operation of the carriage motors in this event.

Figure 2B:
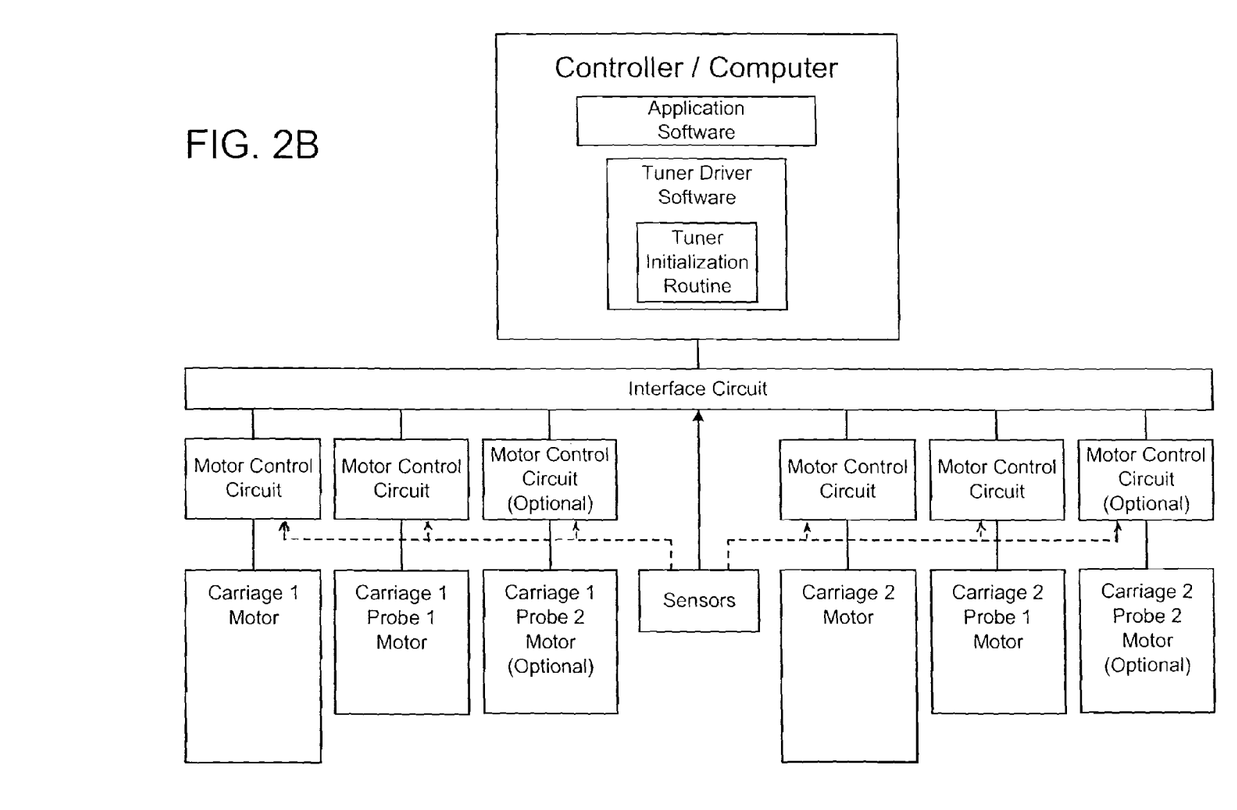
FIG. 2B is an electrical schematic block diagram of an exemplary embodiment of a two-carriage impedance tuner.

FIG. 2B is a simplified electrical schematic block diagram illustrating an exemplary embodiment of electronic/electrical features for an exemplary two-carriage impedance tuner system such as tuner system 50. A controller/computer may be a device or system remotely located relative to the impedance tuner 50, or in some cases built into the tuner. The controller/computer is typically programmable, and includes application software configured to control operation of the tuner, e.g. for testing DUTs in various test modes, e.g. without limitation load pull, source pull, noise parameter measurements, and ruggedness testing. The controller/computer also includes tuner driver software configured to provide drive commands to the tuner motors, under control of the application software. The tuner driver software includes a tuner initialization routine or algorithm, configured to initialize the tuner upon power up or reset. The initialization routine in this embodiment carries out the carriage initialization to determine initial or zero positions of the carriage motors. The controller/computer is connected to an interface circuit, e.g. a USB interface circuit, to which are connected the motor control circuits for the carriage (horizontal drive) and probe (vertical drive) motors and, in an exemplary embodiment, the sensors, including sensors 62, 72 and 74.

In this exemplary embodiment, each carriage may hold two probes spaced apart along the horizontal direction, and each is vertically positioned by a probe motor (1 and 2). In this embodiment, the carriage 1 (60) motor (horizontal drive) is driven by a motor control circuit, and the respective carriage 1 probe 1 and carriage 1 probe 2 motor (vertical drive) are each driven by a motor control circuit, all under control of the controller/computer. Similarly, the carriage 2 (70) motor (horizontal drive) is driven by a motor control circuit, and the respective carriage 2 probe 1 and carriage 2 probe 2 motor (vertical drive) are each driven by a motor control circuit, all under control of the controller/computer. The sensor signals may be processed by the controller/computer, or by the motors or the motor control circuits, depending on the implementation. In other embodiments, each carriage may support a single probe, or more than two probes.

Figure 2C:
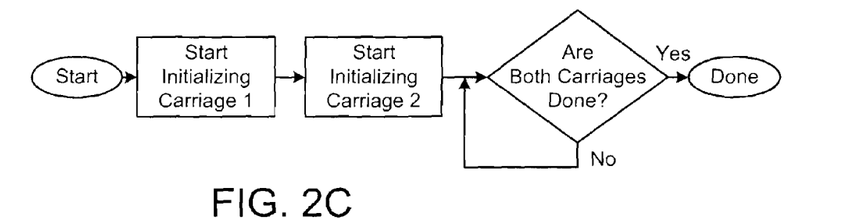
FIG. 2C is a simplified flow diagram illustrating an exemplary carriage initialization process for initializing the positions of the tuner carriages of the embodiment of FIG. 2A.

Exemplary features of an initialization routine for the two-carriage tuner system 50 are shown in the flow diagram of FIG. 2C. After routine startup, separate subroutines or software threads for initializing the position of both carriages 1 (60) and 2 (70) can be started and run simultaneously to initialize the carriages to the respective zero positions. The initialization of carriage 1 (60) includes sending motor drive commands to cause the carriage motor for carriage 60 to move the carriage toward the end wall 52. Similarly, the initialization of carriage 2 (70) includes sending motor drive commands to cause the carriage motor for carriage 70 to move the carriage 70 toward the end wall 54. Both carriages may be driven simultaneously, since the respective carriages are initialized at the fixed positions determined in this case by the end walls 52, 54, although other fixed positions could be established within the tuner by appropriate positioning of sensor pins or features interior of the end walls. The initialization routines can include incrementally moving and then stopping the carriages to minimize the momentum of the carriage before the sensors are tripped. The initialization proceeds until both carriages have reached the fixed zero positions as determined by the sensors 62 and 72. The controller records these positions as the zero positions, so that future positioning of the carriages is determined from these zero positions. Not shown in FIG. 2C are other features of the initialization routine, such as the initialization of the probe positions, which may also be done using sensors to indicate upper and/or lower travel limits of the probes in the vertical direction.

In an alternate embodiment, the initialization routines can include sequential initialization of the carriages, so that the carriage 60 initialization is completed first, before starting the initialization of carriage 70, for example. This may add to the initialization time, but can be simpler to implement in some applications.

Figure 3A:
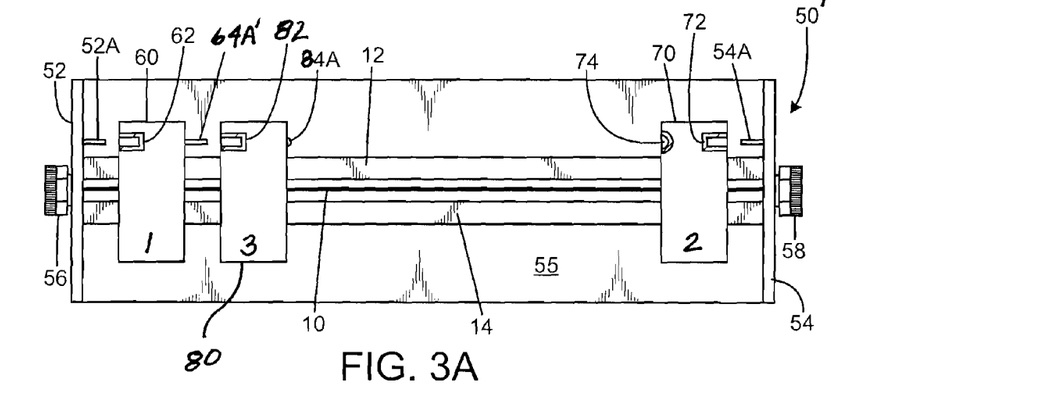
FIG. 3A is a diagrammatic top view illustrating features of an exemplary embodiment of a three-carriage impedance tuner.
Figure 3B:
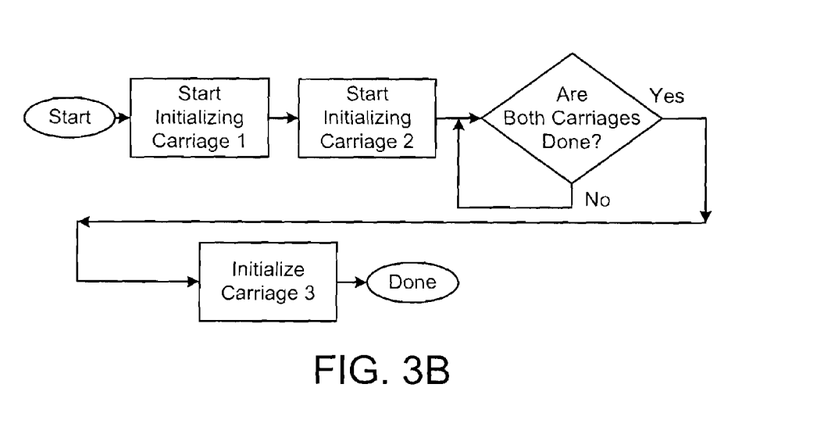
FIG. 3B is a simplified flow diagram illustrating an exemplary carriage initialization process for initializing the positions of the tuner carriages of the embodiment of FIG. 3A.

Features of another embodiment of an impedance tuner 50' are shown in FIGS. 3A and 3B. This embodiment is similar to the two-carriage tuner system 50, but adds a third probe carriage 80, with a carriage (horizontal drive) motor and two probes (not visible in FIG. 3A) carried by the carriage 80 with respective probe (vertical drive) motors. With more than two carriages, each of the outside carriages 60 and 70 initialize to fixed zero positions at opposite ends of the tuner chassis, as with the two-carriage embodiment. Additional carriages may initialize relative to one of the first two carriages. In the example of FIG. 3A, the third carriage 80 is initialized relative to the first carriage 60. To provide this, the carriage 80 includes a sensor 82 on the carriage sidewall facing carriage 60, configured to sense a pin or other feature 64A' on the facing sidewall of carriage 60. This enables the position of carriage 80 to be initialized by reference to the initial position of carriage 60. The fail safe sensor 74 of carriage 70 will be tripped by sensing a feature 84A on the carriage 80 wall facing carriage 70.

FIG. 3C illustrates an exemplary initialization routine for the three-carriage tuner 50'. The initialization routine is similar to that for the two-carriage tuner, except that, after the outer carriages 1 (60) and 2 (70) have completed initialization by moving the carriages outwardly toward the respective end walls until the sensors 62 and 72 are tripped, carriage 3 (80) is initialized by commanding the carriage horizontal drive motor to move toward end wall 52 until sensor 82 is tripped, indicating the zero position adjacent the carriage 60. This position is saved as the zero position for the carriage motor for carriage 80.

Figure 4A:
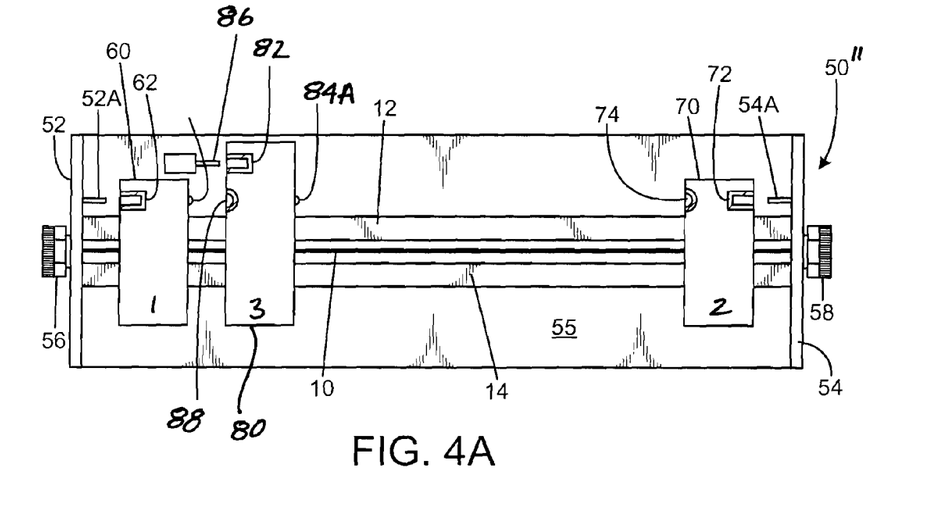
FIG. 4A is a diagrammatic top view illustrating features of an alternate embodiment of a three-carriage impedance tuner.

FIG. 4A illustrates another embodiment of a three-carriage tuner 50". As with the tuner 50', each of the outside carriages 60 and 70 initializes to fixed zero positions at opposite ends of the tuner chassis. Additional probe carriages such as third carriage 80' may initialize to a fixed zero position defined by a fixed sensor feature 86 mounted in a fixed position relative to the tuner chassis, e.g. mounted on a side wall or on the bottom wall. In this example, the sensor 82 is triggered by proximity to the feature 86 to establish the initial or zero position for the carriage 80'. A fail safe sensor 88 on the carriage 80' side wall facing carriage 60 is triggered by proximity to sensor feature 66 on carriage 60. The fail safe sensor 74 on carriage 70 is triggered by feature 84A on carriage 80' as before.

The initialization routine for tuner 80" is the same as shown in FIG. 3B for tuner 80'. The zero position for carriage 80' is set by fixed sensor feature 88 for this example.

Figure 5A:
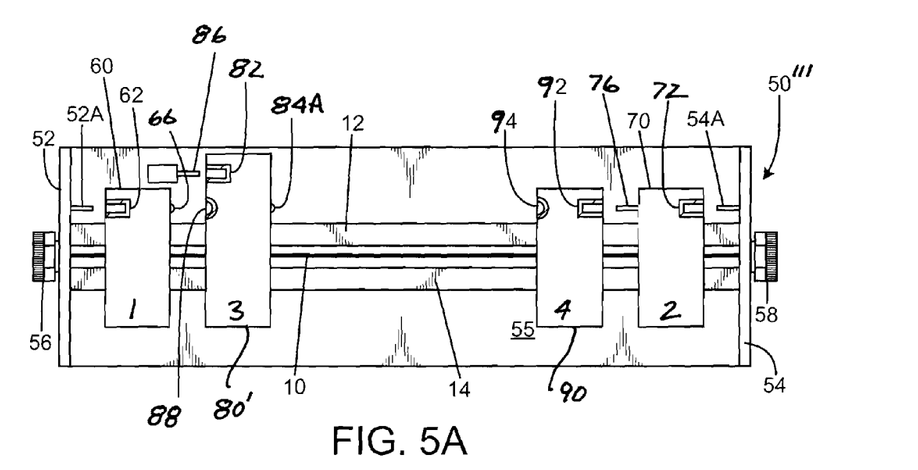
FIG. 5A is a diagrammatic top view illustrating features of an exemplary embodiment of a four-carriage impedance tuner.

FIG. 5A illustrates another exemplary embodiment of a tuner 50'''. This embodiment is similar to the tuner 50" of FIG. 4A, except that the tuner includes a fourth probe carriage 90. As with the previously described embodiments, each of the outside carriages 60 and 70 initialize to fixed zero positions at opposite ends of the tuner chassis. Additional carriages such as carriages 80' and 90 may initialize to a fixed position or a position relative to one of the first two carriages, and the mode could be different for different carriages. In this example, the third carriage 80' is initialized to a fixed zero position (as described above regarding tuner 50") and the fourth carriage 90 is initialized to a zero position that is relative to the second carriage 70 on the right side. The carriage 90 includes a sensor 92 on a side wall facing the carriage 70, which carries a sensor feature 76 on its facing side wall. The sensor 92 will be triggered by proximity to sensor feature 76 in an initialization routine. The fourth probe carriage 80 includes, in this exemplary embodiment, a carriage (horizontal drive) motor and two probes (not visible in FIG. 5A) carried by the carriage 90 with respective probe (vertical drive) motors.

Figure 5B:
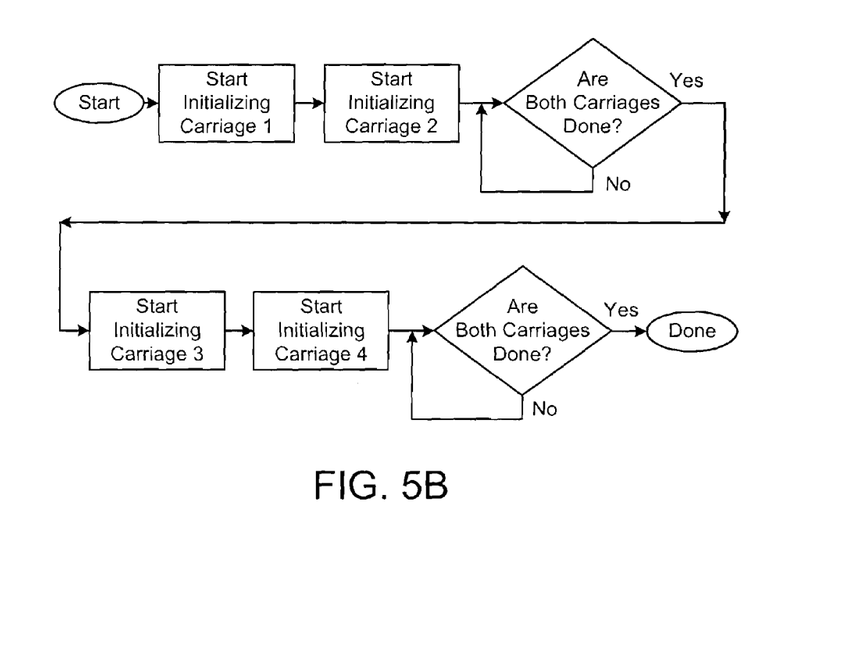
FIG. 5B is a simplified flow diagram illustrating an exemplary carriage initialization process for initializing the positions of the tuner carriages of the embodiment of FIG. 5A.

FIG. 5B illustrates a simplified carriage initialization routine for the tuner 50'''. The initialization routine is similar to that for the two-carriage tuner and the three-carriage tuner, except that, after the outer carriages 1 (60) and 2 (70) have completed initialization by moving the carriages outwardly toward the respective end walls until the sensors 62 and 72 are tripped, then the initialization of carriages 3 (80') and 4 (90) is commenced. This includes commanding the carriage 80' horizontal drive motor to move the carriage 80' toward end wall 52 and sensor feature 86 until sensor 82 is triggered, indicating the zero position for carriage 80'. This position is saved as the zero position for the carriage motor for carriage 80'. Simultaneously, the carriage 90 horizontal drive motor is commanded to move the carriage toward end wall 54 and carriage 70, until sensor 92 is triggered indicating proximity to carriage 70. This position of the carriage 90 motor is saved as the zero position for that motor. Here again, the initialization routines can include incremental movements to reduce the momentum of the carriages when tripping the zero position sensors.

In another alternate embodiment, one or more of the carriage initial positions is not adjacent an end wall, but rather at another fixed position. For example, the system shown in FIG. 5A may be modified to be a two-carriage tuner using carriages 60 and 80' as the carriages 1 and 2. The initial position of carriage 1 in this case would still be adjacent end wall 52, but the initial position of carriage 2 would be set by the position of fixed sensor feature 86. In this case, the initialization of carriages 1 and 2 would typically not be simultaneous, but rather sequentially with carriage 1 first initialized and then carriage 2 initialized.

Figure 6:
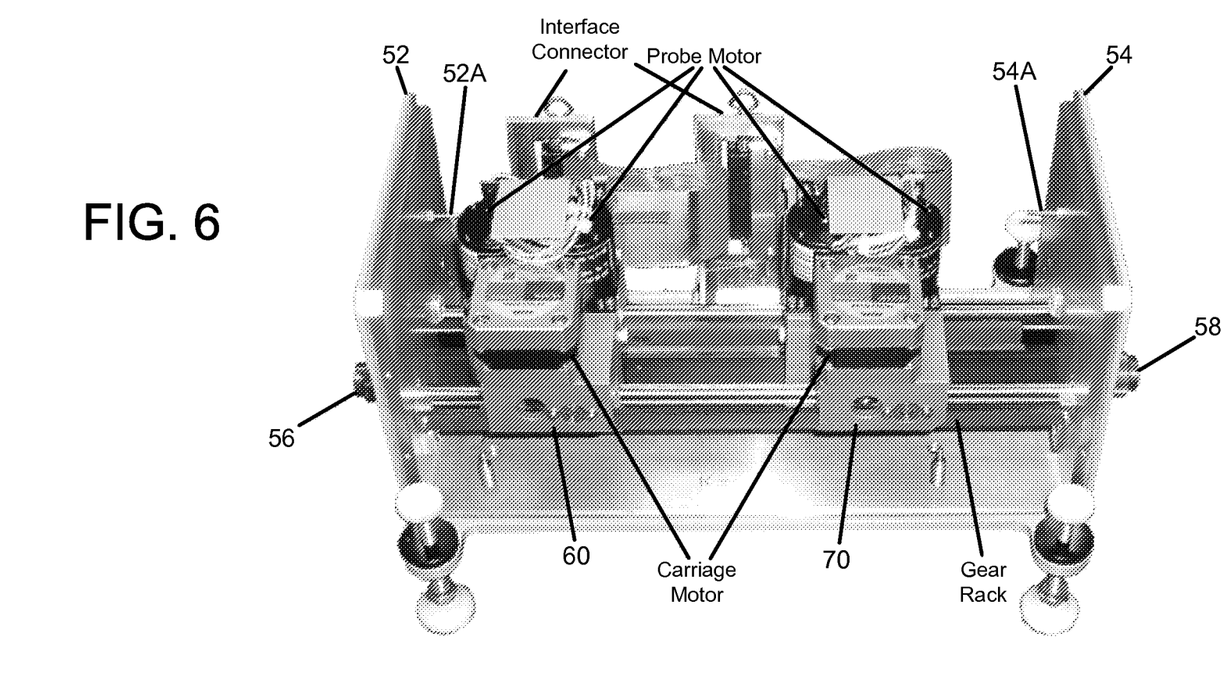
FIG. 6 is a photograph of an exemplary embodiment of a dual or two-carriage impedance tuner.

FIG. 6 is a photograph of an exemplary two-carriage tuner system, as described above regarding FIGS. 2A-2C. Like reference numbers are employed in FIG. 6 for like elements in FIGS. 2A-2C.

Although the foregoing has been a description and illustration of specific embodiments of the subject matter, various modifications and changes thereto can be made by persons skilled in the art without departing from the scope and spirit of the invention.

The invention claimed is:

1. A mechanical impedance tuner with at least two probe carriages, where at least two of the carriages are initialized at fixed positions, the tuner comprising:
    a center conductor;
    at least two probe carriages mounted for movement along an axis parallel to the center conductor, and wherein no wall separates the at least two probe carriages, said at least two probe carriages including a first probe carriage and a second probe carriage;
    a carriage drive system connected to the at least two probe carriages for driving the at least two probe carriages along the axis in response to carriage drive signals, the carriage drive system including a first drive motor for driving the first probe carriage along the axis and a second drive motor for driving the second probe carriage along the axis; and
    a controller for controlling operation of the carriage drive system during an initialization process, the controller configured to drive the first drive motor to position the first carriage at a first fixed initialization position by executing a first algorithm, and to drive the second drive motor to position the second carriage at a second fixed initialization position by executing a second algorithm, said second fixed initialization position being independent of the first carriage at said first initialization position, the controller further configured to store zero or home positions for the first and second motors corresponding to the first and second initialization positions, respectively.

2. The tuner of claim 1, wherein:
    said at least two probe carriages comprises a third probe carriage arranged for movement along said axis and between the first and second probe carriages;
    said carriage drive system comprises a third drive motor for driving the third probe carriage along the axis;
    said controller is configured to execute a third algorithm for driving the third drive motor to position the third carriage at a third initialization position, said third initialization position for the third probe carriage is relative to one of said first or second probe carriages when positioned at its corresponding first or second initialization position.

3. The tuner of claim 1, wherein the controller is configured to execute the first and second algorithms such that the first and second carriages are in motion along the axis simultaneously.

4. The tuner of claim 1, wherein each of said first and second motors is a stepper motor.

5. The tuner of claim 4, wherein said controller is configured to perform the initialization process after electrical power has been applied to the tuner.

6. The tuner of claim 1, further including a tuner chassis and spaced first and second end walls, where the first fixed initialization position and the second fixed initialization position are adjacent the first and second end walls, respectively.

7. The tuner of claim 6, further comprising:
  a first sensor providing a first sensor signal to the controller, said first sensor configured to generate the first signal indicative of the first carriage proximate the first end wall to establish the first fixed initialization position; and
  a second sensor providing a second sensor signal to the controller, said second sensor configured to generated the second signal indicative of the second carriage proximate the second end wall to establish the second fixed initialization position.

8. The tuner of claim 7, wherein the controller is configured with the first algorithm to drive the first motor to move the first carriage in a first direction along the axis toward the first end wall until the first sensor signal indicates the first carriage is proximate the first end wall, and the controller is configured to store the first motor position to establish a zero or home position of the first motor so that future positioning of the first carriage is determined from this zero position, and the controller is configured with the second algorithm to drive the second motor to move the second carriage in a second direction along the axis toward the second end wall until the second sensor signal indicates the second carriage is proximate the second end wall, and the controller is configured to store the second motor position to establish a zero or home position of the second motor so that future positioning of the second carriage is determined from this zero position.

9. A mechanical impedance tuner with at least two probe carriages, where at least two of the carriages are initialized at fixed positions, the tuner comprising:
  a center conductor;
  at least two probe carriages mounted for movement along an axis parallel to the center conductor, said at least two probe carriages including a first probe carriage and a second probe carriage;
  a carriage drive system connected to the at least two probe carriages for driving the at least two probe carriages along the axis in response to carriage drive signals, the carriage drive system including a first drive motor for driving the first probe carriage along the axis and a second drive motor for driving the second probe carriage along the axis;
  a controller for controlling operation of the carriage drive system during an initialization process, the controller configured to execute a first algorithm for driving the first drive motor to position the first carriage at a first fixed initialization position and to execute a second algorithm for driving the second drive motor to position the second carriage at a second fixed initialization position, said second fixed initialization position being independent of the first carriage at the first initialization position;
  a first sensor providing a first sensor signal to the controller, said first sensor configured to generate the first signal indicative of the first carriage proximate the first end wall to establish the first fixed initialization position; and
  a second sensor providing a second sensor signal to the controller, said second sensor configured to generated the second signal indicative of the second carriage proximate the second end wall to establish the second fixed initialization position; and
  a third sensor configured to sense a fault condition that the first and second carriages are very close to each other and provide a third sensor signal to the controller indicative of the fault condition.

10. The tuner of claim 9, wherein the controller is configured to shut down operation of the first and second carriage motors in response to said fault condition.

11. A mechanical impedance tuner with at least two probe carriages, where at least two of the carriages are initialized at fixed positions, the tuner comprising:
  a center conductor;
  at least two probe carriages mounted for movement along an axis parallel to the center conductor, said at least two probe carriages including a first probe carriage and a second probe carriage;
  a carriage drive system connected to the at least two probe carriages for driving the at least two probe carriages along the axis in response to carriage drive signals, the carriage drive system including a first drive motor for driving the first probe carriage along the axis and a second drive motor for driving the second probe carriage along the axis; and
  a controller for controlling operation of the carriage drive system during an initialization process, the controller configured to execute a first algorithm for driving the first drive motor to position the first carriage at a first fixed initialization position and to execute a second algorithm for driving the second drive motor to position the second carriage at a second fixed initialization position, said second fixed initialization position being independent of the first carriage at the first initialization position; and wherein:
  said at least two probe carriages comprises a third probe carriage arranged for movement along said axis and between the first and second probe carriages;
  said carriage drive system comprises a third drive motor for driving the third probe carriage along the axis;
  said controller is configured to execute a third algorithm for driving the third drive motor to position the third carriage at a third fixed initialization position defined by a fixed sensor.

12. A mechanical impedance tuner with at least two carriages, the tuner comprising:
  a center conductor;
  at least two probe carriages mounted for movement along an axis parallel to the center conductor, and wherein no wall separates the at least two probe carriages, said at least two probe carriages including a first probe carriage and a second probe carriage;
  a carriage drive system connected to the at least two probe carriages for driving the at least two probe carriages along the axis in response to carriage drive signals, the carriage drive system including a first drive motor for driving the first probe carriage along the axis and a second drive motor for driving the second probe carriage along the axis; and a controller for controlling operation of the carriage drive system during an initialization process, the controller configured to execute a first algorithm for driving the first drive motor to position the first carriage at a first fixed initialization position and to execute a second algorithm for driving the second drive motor to position the second carriage at a second fixed initialization position, wherein at least one of the first and second initialization positions is defined by a fixed sensor that is not at an end of the tuner.

13. A method for initializing a mechanical impedance tuner with at least two probe carriages and a center conductor and with no wall separating the at least two probe carriages, each of the at least two probe carriages moveable independently along an axis parallel to the center conductor by commanding respective carriage drive motors, the initialization method comprising a sequence of the following steps:

commanding a first carriage drive motor to move the first probe carriage in a first direction along the axis;

commanding a second carriage drive motor to move the second probe carriage in a second direction along the axis opposite the first direction;

recording as a first carriage zero or home position of the first motor a first fixed initialization location indicated by a first sensor signal generated by proximity of the first carriage to the first fixed initialization location so that future positioning of the first carriage is determined from this first zero or home position;

recording as a second carriage zero or home position of the second motor a second fixed initialization location indicated by a second sensor signal generated by proximity of the second carriage to the second fixed initialization location so that future positioning of the second carriage is determined from this second zero or home position, and wherein the second fixed initialization location is independent of the first carriage at the first fixed initialization location.

14. The method of claim 13, wherein the mechanical tuner includes a tuner chassis and opposed first and second end walls, and wherein the first fixed initialization location is at or adjacent the first end wall and the second fixed initialization location is at or adjacent the second end wall.

15. The method of claim 14, wherein said steps of commanding a first carriage drive motor and commanding a second carriage drive motor result in the first and second carriages moving along the axis simultaneously and in opposite directions.

* * * * *